(12) United States Patent
Ortner et al.

(10) Patent No.: US 9,704,748 B2
(45) Date of Patent: Jul. 11, 2017

(54) METHOD OF DICING A WAFER

(71) Applicant: Infineon Technologies AG, Neubiberg (DE)

(72) Inventors: Joerg Ortner, Drobollach (AT); Michael Roesner, Villach (AT); Gudrun Stranzl, Goedersdorf (AT); Rudolf Rothmaler, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/751,035

(22) Filed: Jun. 25, 2015

(65) Prior Publication Data

US 2016/0379884 A1    Dec. 29, 2016

(51) Int. Cl.
| | |
|---|---|
| *H01L 21/78* | (2006.01) |
| *H01L 21/308* | (2006.01) |
| *H01L 21/3065* | (2006.01) |
| *G03F 1/38* | (2012.01) |

(52) U.S. Cl.
CPC ............... *H01L 21/78* (2013.01); *G03F 1/38* (2013.01); *H01L 21/3065* (2013.01); *H01L 21/3083* (2013.01)

(58) Field of Classification Search
CPC ... H01L 21/78; H01L 21/304; H01L 21/3065; H01L 21/3083; H01L 21/3043
USPC .............................. 257/620; 438/462; 430/5
See application file for complete search history.

(56) References Cited

U.S. PATENT DOCUMENTS

| | | | |
|---|---|---|---|
| 2004/0052512 A1* | 3/2004 | Aderhold .......... | H01L 21/67248 392/418 |
| 2010/0197115 A1* | 8/2010 | Arita .................. | H01L 21/6835 438/462 |
| 2011/0193200 A1* | 8/2011 | Lyne .................. | H01L 22/20 257/622 |
| 2011/0281377 A1* | 11/2011 | Yamada ............. | H01L 21/6836 438/10 |
| 2012/0100694 A1* | 4/2012 | Kajiyama ........... | H01L 21/78 438/462 |
| 2012/0322239 A1* | 12/2012 | Singh ................. | H01L 21/78 438/462 |
| 2015/0270173 A1* | 9/2015 | Grivna ............... | H01L 21/78 438/462 |

* cited by examiner

*Primary Examiner* — Cuong Q Nguyen
*Assistant Examiner* — Tong-Ho Kim
(74) *Attorney, Agent, or Firm* — Dicke, Billig & Czaja, PLLC (57) ABSTRACT

A method of dicing a wafer includes providing a wafer and etching the wafer to singulate die between kerf line segments defined within an interior region of the wafer and to singulate a plurality of wafer edge areas between the kerf line segments and a circumferential edge of the wafer. Each one of the plurality of wafer edge areas is singulated by kerf lines that each extend between one of two endpoints of one of the kerf line segments and the circumferential edge of the wafer.

35 Claims, 10 Drawing Sheets

METHOD OF DICING A WAFER

TECHNICAL FIELD

The present application relates to a method of dicing a wafer, in particular, a method of singulating a plurality of wafer edge areas.

BACKGROUND

During semiconductor wafer processing, integrated circuits or die are formed on thin wafer substrates that are made of silicon or other materials. After wafer processing is complete, the die must be singulated or separated into individual die before they are packaged. This singulation process is referred to as wafer dicing. One technique that is used for wafer dicing is mechanical sawing. With this approach, a high speed rotating saw is used to separate adjacent die along kerf lines, which are also known as dicing channels or streets. Another technique that is used for wafer dicing is a laser-based approach that is referred to as stealth dicing. Due to the abrasive nature of performing mechanical dicing with a saw, chipping, mechanical stress and crack formation can occur near the outer edges of the wafer which can reduce die reliability and wafer yields. Because of the intense thermal effect that laser dicing has on a silicon wafer, laser dicing can also cause crack formation and deposits near the outer edges of the wafer which can reduce die reliability and wafer yields.

Plasma dicing is another technique that is used for wafer dicing. Because plasma dicing is a dry etch process that does not require physical or thermal contact with a wafer, many of the problems inherent with mechanical or laser dicing can be avoided. Plasma dicing is based on a multiplexed deep reactive ion etching (DRIE) technique and can be performed on wafers mounted in standard tape frames or carriers. To prepare wafers for plasma dicing, a lithographic process is used to define the kerf lines that will be etched on the wafer. The kerf lines typically extend to the edge of the wafer and therefore can include adjacent partial die near the wafer edges. This lithographic process enables direct access by plasma during the etching step to etch through the wafer along the kerf lines. With plasma dicing after grinding (PDAG), also referred to as dicing post grinding (DPG), the wafer is thinned and mounted onto an adhesive underlayer or glue within a wafer carrier before undergoing the plasma singulation process.

If relatively large die are to be plasma diced on a wafer, the lithographic process performed prior to dicing will expose kerf lines that extend up to the edge of the wafer. Due to their size and corresponding large contact area with the adhesive underlayer in the wafer carrier, these die, including the partial die located near the edge of the wafer, remain temporarily well-bonded to the adhesive underlayer after plasma singulation and during subsequent processing steps (e.g., lamination, demounting, etc. . . . ), before pick and place tape release techniques are used to remove the die from the adhesive underlayer for packaging.

Smaller die will have a smaller contact area with the adhesive underlayer. Because the lithographic process performed prior to plasma dicing will expose kerf lines that extend up to the edge of the wafer, these die, and especially the partial die located near the edge of the wafer, are significantly more prone to chipping and cracking and subsequent delamination from the adhesive underlayer after plasma singulation is complete.

While plasma dicing can reduce the overall amount of wafer chipping and cracking as compared to other dicing approaches such as laser dicing, all dicing methods will have the chipping, cracking and deposit formation problems inherent with smaller die. This can be a significant problem for integrated circuit manufacturers that supply integrated circuits to customers in the automotive and industrial applications areas that impose zero defect requirement standards on their suppliers. One technique that has been used to help avoid the chipping and cracking problem with smaller die is to shield or prevent kerf lines near the outer edge of the wafer from being etched. Use of this technique however will leave an unetched ring of material around the edge of the wafer that requires an additional process step for removal before pick and place techniques can be used for packaging the die.

SUMMARY

According to an embodiment of a method of dicing a wafer, the method includes providing a wafer and etching the wafer to singulate die between kerf line segments defined within an interior region of the wafer and to singulate a plurality of wafer edge areas between the kerf line segments and a circumferential edge of the wafer. Each one of the plurality of wafer edge areas is singulated by kerf lines that each extend between one of two endpoints of one of the kerf line segments and the circumferential edge of the wafer.

According to an embodiment of a wafer, the wafer includes a plurality of singulated die between kerf line segments defined within an interior region of the wafer and a plurality of singulated wafer edge areas between the kerf line segments and the circumferential edge of the wafer. Each one of the plurality of wafer edge areas is between kerf lines that each extend between one of two endpoints of one of the kerf line segments and the circumferential edge of the wafer.

According to an embodiment of a lithography mask, the lithography mask includes a first feature set for patterning a material on a wafer to define kerf line segments within an interior region of the wafer, and includes a second feature set for patterning the material on the wafer to define kerf lines that each extend between one of two endpoints of one of the kerf line segments and the circumferential edge of the wafer. The first feature set defines die to be singulated, and the second feature set defines a plurality of wafer edge areas to be singulated.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION OF ILLUSTRATIVE EMBODIMENTS

Figure 1A:
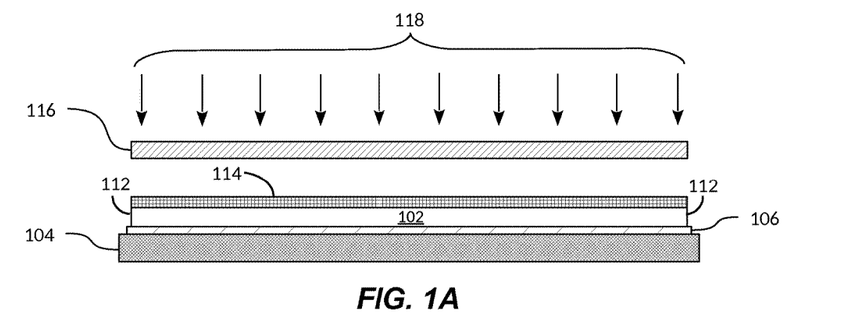
FIGS. 1A-1C illustrate cross-sectional views, respectively, of embodiments of dicing a wafer.
Figure 1B:
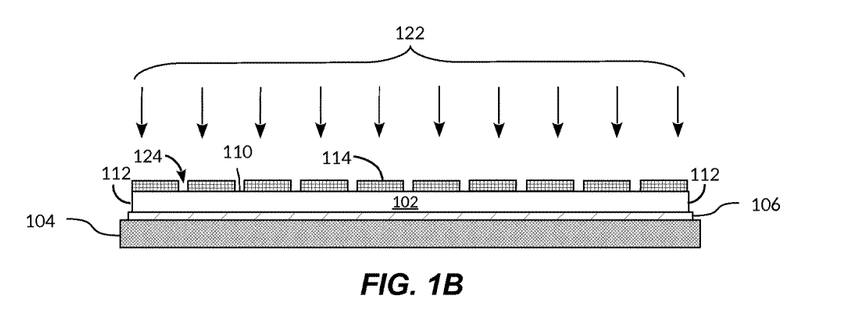
Figure 1C:
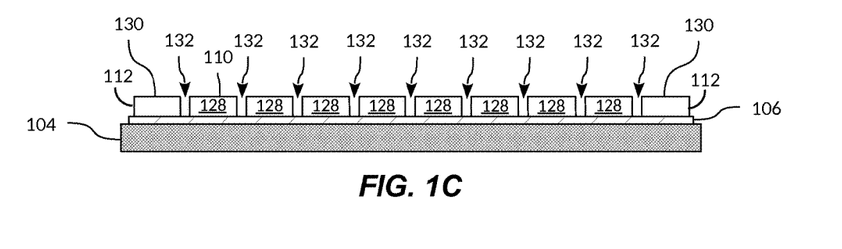

FIGS. 1A-1C illustrate cross-sectional views, respectively, of embodiments of dicing a wafer 102. FIG. 1A illustrates a cross-sectional view of an embodiment of a wafer 102 undergoing a lithographic process to structure scribe lines 124 prior to plasma dicing. FIG. 1B illustrates a cross-sectional view of an embodiment of a wafer 102 that is inside a plasma reaction chamber and undergoing exposure to a plasma 122 to perform a deep etch through scribe lines 124 to define the kerf lines 132. FIG. 1C illustrates wafer 102 after plasma dicing and shows die 128 and a plurality of wafer edge areas 130 that are singulated by kerf lines 132.

In the illustrated embodiments, wafer 102 can have any suitable size such as 200 mm or 300 mm. In the illustrated embodiments, wafer 102 is a silicon (Si) wafer. In other embodiments, wafer 102 can be formed from other suitable materials that include, but are not limited to, Silicon Germanium (SiGe), Silicon on Insulator (SOI), Silicon Carbide (SiC) and Gallium Arsenide (GaAs). Die 128 are active areas or regions within wafer 102. In various embodiments, each die 128 can include discrete devices such as a transistor, or can include a number of transistors and/or other components and form an integrated circuit.

FIG. 1A illustrates a cross-sectional view of an embodiment of a wafer 102 undergoing a lithographic process to prepare wafer 102 for plasma dicing. Wafer 102 is bonded to a glass wafer carrier 104 by an adhesive layer 106. Wafer 102 has a circumferential edge that is defined at 112. In the illustrated embodiment, wafer 102 is thinned by a grinding process prior to being mounted on wafer carrier 104. The lithographic process is used to define the locations of scribe lines 124. The lithographic process includes forming a layer of photoresist material 114 over a top surface 110 of wafer 102. Photoresist layer 114 is patterned by exposure through lithography mask 116 to a light source 118 such as an ultraviolet light. In the illustrated embodiment, lithography mask 116 is a Chrome On Glass (COG) lithography mask. In other embodiments, lithography mask 116 can be other suitable types of lithography masks. In the illustrated embodiment, lithography mask 116 includes patterns or feature sets that will be transferred to wafer 102 after exposure when photoresist layer 114 is developed. These patterns or feature sets are illustrated in FIG. 1B as scribe lines 124 within photoresist layer 114. Scribe lines 124 identify the areas of wafer 102 that will undergo a deep etch through wafer 102 by plasma 122 to define kerf lines 132.

In other embodiments, other suitable masking approaches such as use of an ashable hardmask (AHM) can be used in place of photoresist 114.

FIG. 1B illustrates a cross-sectional view of an embodiment of a wafer 102 that is inside a plasma reaction chamber and undergoing exposure to plasma 122. Suitable plasma etch processes include, but are not limited to, Chlorine-based processes and Flourine-based processes. Plasma 122 etches wafer 102 along the locations of scribe lines 124 to define kerf lines 132. Kerf lines 132 are etched completely through wafer 102 and singulate die 128 and singulate a plurality of wafer edge areas 130. FIG. 1C illustrates a singulated wafer 102 after plasma dicing and after photoresist layer 114 has been stripped and shows die 128 and a plurality of wafer edge areas 130 that have been singulated by kerf lines 132.

In other embodiments, other suitable lithographic approaches can be used to define scribe lines 124 and/or kerf lines 132. These approaches include, but are not limited to, maskless lithography processes such as electron beam lithography or Laser Direct Imaging (LDI). These processes utilize a narrow focused beam of radiation to write the patterns that define scribe lines 124 on photoresist layer 114. With maskless lithography processes, the pattern or feature set information is contained within a design or data file that is used by the lithography tool to expose the scribe lines 124.

Figure 2:
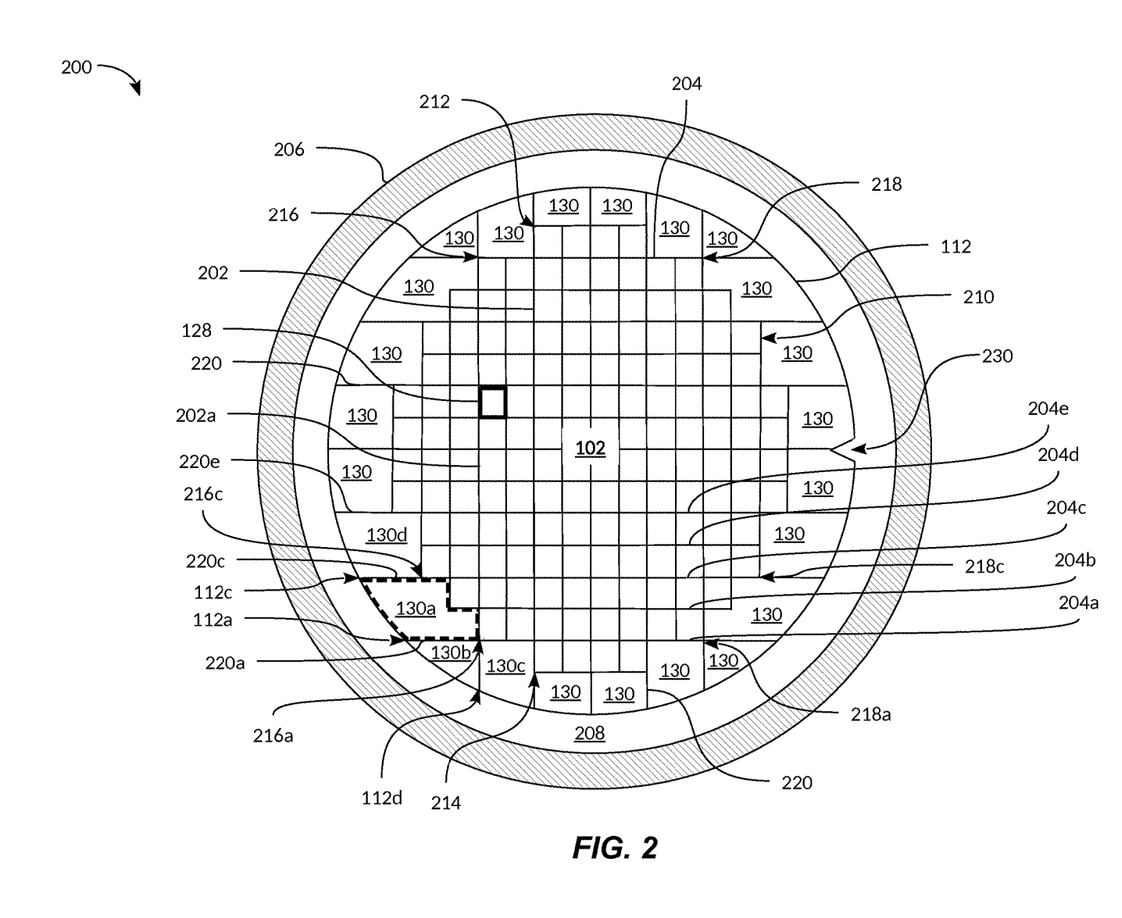
FIG. 2 illustrates a top plan view of an embodiment of a singulated wafer mounted in a wafer frame.

In various embodiments, once plasma singulation is complete as illustrated in FIG. 1C, a laminate and demount or tape debonding process is used to prepare the singulated wafer 102 for packaging. With this process, a wafer frame 206 is placed around singulated wafer 102 and an adhesive dicing tape or foil 208 is placed over the wafer frame 206 and laminated to a top surface 110 of singulated wafer 102. A debonding process is used to detach singulated wafer 102 from adhesive layer 106 and wafer carrier 104. FIG. 2 illustrates an exemplary embodiment of a debonded and singulated wafer 102 that is laminated to a foil 208 and held within a wafer frame 206. In various embodiments, before pick and place tape release techniques are used to remove the die 128 from foil 208 for packaging, foil 208 can be expanded to avoid issues such as die knocking.

FIG. 2 illustrates a top plan view at 200 of an embodiment of a singulated wafer 102 mounted in a wafer frame 206. In the embodiment illustrated in FIG. 2, the methods illustrated in FIGS. 1A-1C can be used to singulate die 128 and to singulate a plurality of wafer edge areas 130. The die 128 are located between vertical kerf line segments 202 and horizontal kerf line segments 204. Kerf line segments 202 and 204 are located within an interior region 210 of singulated wafer 102. Wafer 102 includes an alignment notch that is illustrated at 230.

Figure 3:
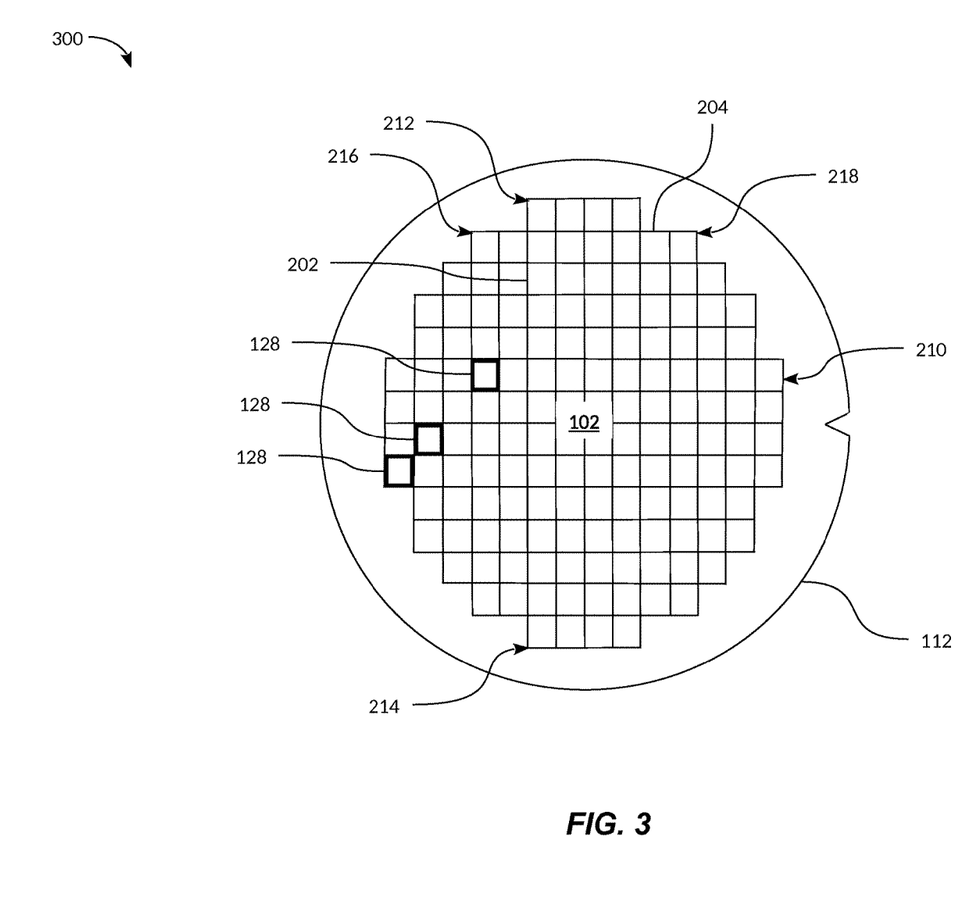
FIG. 3 illustrates a top plan view of an embodiment of a wafer that illustrates kerf line segments within an interior region of a wafer.

FIG. 3 illustrates a top plan view at 300 of an embodiment of a wafer 102 that illustrates horizontal and vertical kerf line segments within an interior region 210 of wafer 102. FIG. 3 does not include the plurality of singulated wafer edge areas 130. Vertical and horizontal kerf line segments are illustrated at 202 and 204, respectively. Each vertical kerf line segment 202 has two endpoints as illustrated at 212 and 214. Each horizontal kerf line segment 204 has two endpoints as illustrated at 216 and 218. Interior region 210 lies along an outer boundary of singulated die 128 and is defined by interconnected portions of kerf line segments 202-204 between adjacent endpoints 212-214 and/or endpoints 216-218.

FIG. 2 illustrates a plurality of singulated wafer edge areas 130 between the kerf line segments 202-204 and the circumferential edge 112 of wafer 102. Each one of the plurality of wafer edge areas 130 is singulated by two kerf lines 220 that each extend between one of two endpoints 212-214 or 216-218 of the corresponding kerf line segment 202-204 and the circumferential edge 112 of wafer 102.

In the embodiment illustrated in FIG. 2, wafer edge area 130a is illustrated by a dashed line. Wafer edge area 130a is singulated by kerf line 220a and kerf line 220c. Kerf line 220a extends between endpoint 216a of kerf line segment 204a and a point 112a along the circumferential edge 112 of wafer 102. Kerf line 220c extends between endpoint 216c of kerf line segment 204c and a point 112c along the circumferential edge 112 of wafer 102. Wafer edge area 130a is singulated along a boundary of interior region 210 as illustrated by interconnected kerf line segments 202-204 between the endpoints 216a and 216c.

In the embodiment illustrated in FIG. 2, wafer edge areas 130 can be singulated by kerf lines that are parallel as illustrated by wafer edge area 130a or can be singulated by kerf lines that are perpendicular as illustrated by wafer edge area 130b. Wafer edge area 130b is singulated by kerf lines 220 that are perpendicular and intersect at 90° at endpoint 216a. In other embodiments, wafer edge areas 130 can be singulated by kerf lines that intersect at other suitable angles such as 45°. Referring to FIG. 2, corresponding kerf line segments 204a and 202a are respectively horizontal and vertical and share endpoint 216a at the point of intersection of the kerf lines 220 that singulate wafer edge area 130b. These kerf lines 220 intersect circumferential edge points 112a and 112d. Circumferential edge point 112a is collinear with both endpoints of the kerf line segment 204a and circumferential edge point 112d is collinear with both endpoints of kerf line segment 202a.

FIG. 2 illustrates an exemplary embodiment with respect to wafer edge area 130a where there are N parallel kerf line segments where N=3 and corresponds to kerf line segments 204a, 204b and 204c. In this exemplary embodiment, wafer edge area is singulated by kerf lines 220a and 220c that each extend between one of two endpoints of every $M^{th}$ kerf line segment and circumferential edge 112 of wafer 102. In this illustration, M=2 and corresponds to kerf line segments 204a and 204c and corresponding endpoints 216a and 216c.

In various embodiments, the N parallel kerf line segments can be N vertical kerf line segments 202 or N horizontal kerf line segments 204. Wafer edge area 130a is singulated by kerf lines 220 that extend from horizontal kerf line segments 204 where N=2. Wafer edge area 130c is singulated by kerf lines 220 that extend from vertical kerf line segments 202 where N=2. In this and other embodiments, N and M can be any suitable number where N is an integer that is equal to or greater than three and M is an integer that is equal to or greater than two and equal to or less than N. For example, FIG. 2 illustrates an embodiment where N=5 and M=2 and wafer edge areas 130a and 130d are singulated by kerf lines (220a, 220c and 220e) that extend from endpoints 216 of every second kerf line segment (204a, 204c and 204e) of five kerf line segments (204a, 204b, 204c, 204d and 204e).

In the embodiment illustrated in FIG. 2, circumferential edge point 112a of kerf line 220a is collinear with endpoints 216a and 218a of kerf line segment 204a which defines kerf line 220a and kerf line segment 204a to be lying along a same kerf line. In the embodiment illustrated in FIG. 2, kerf line 220a has a width (refer to FIG. 6 for definition) that is equal to a width of kerf line segment 204a. In other embodiments, kerf line 220a can have a width that is greater than or less than a width of kerf line segment 204a. Circumferential edge point 112c of kerf line 220c is collinear with endpoints 216c and 218c of kerf line segment 204c which defines kerf line 220c and kerf line segment 204c to be lying along a same kerf line. Kerf line 220c has a width that is equal to a width of kerf line segment 204c. In other embodiments, kerf line 220c can have a width that is greater than or less than a width of kerf line segment 204c.

In the embodiment illustrated in FIG. 2, wafer edge areas 130 are singulated by kerf lines 220 that extend from endpoints of kerf line segments 202 or 204 and intersect the circumferential edge 112 of wafer 102 at points (e.g., 112a, 112b etc. . . . ) that are collinear with the respective kerf line segments 202 or 204. In other embodiments, the kerf lines 220 can intersect circumferential edge 112 at points that are not collinear with their respective kerf line segments 202 and 204 (see also, FIG. 4).

Figure 4:
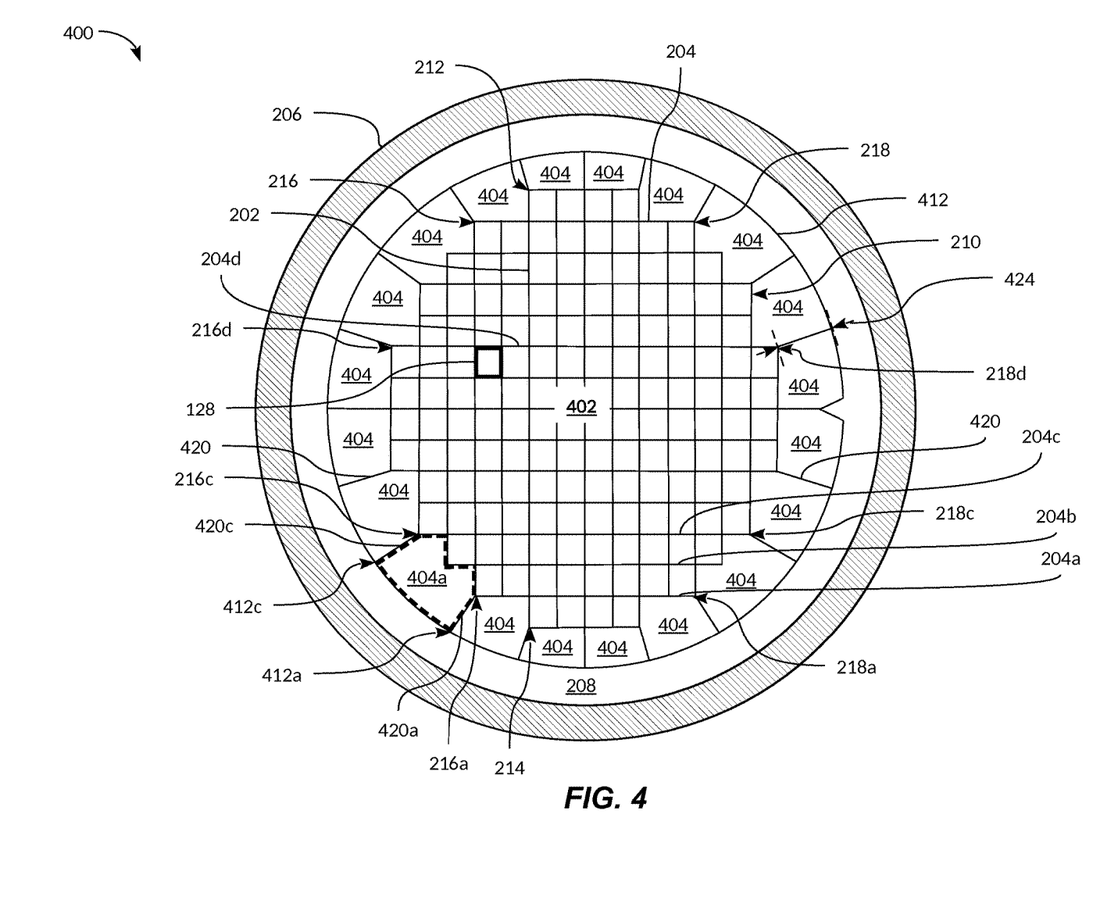
FIG. 4 illustrates a top plan view of an embodiment of a singulated wafer mounted in a wafer frame.

FIG. 4 illustrates a top plan view at 400 of an embodiment of a singulated wafer 402 mounted in a wafer frame 206. In the embodiment illustrated in FIG. 4, the methods illustrated in FIGS. 1A-1C can be used to singulate die 128 and to singulate a plurality of wafer edge areas 404. The die 128 are located between vertical kerf line segments 202 and horizontal kerf line segments 204. Kerf line segments 202 and 204 are located within an interior region 210 of singulated wafer 402. The plurality of singulated wafer edge areas 404 are between kerf line segments 202-204 and the circumferential edge 412 of wafer 402. Each one of the plurality of wafer edge areas 404 is singulated by two kerf lines 420 that each extend between one of two endpoints 212-214 or 216-218 of the corresponding kerf line segment 202-204 and the circumferential edge 412 of wafer 402. One or more of the plurality of wafer edge areas 404 are singulated by kerf lines 420 that are radial with respect to the circumferential edge 412 of wafer 402.

In the embodiment illustrated in FIG. 4, wafer edge area 404a is illustrated by a dashed line. Wafer edge area 404a is singulated by kerf line 420a and kerf line 420c. Kerf line 420a extends between endpoint 216a of kerf line segment 204a and a point 412a along the circumferential edge 412 of wafer 402. Kerf line 420a intersects point 412a in a direction that is radial with respect to circumferential edge 412. Kerf line 420c extends between endpoint 216c of kerf line segment 204c and a point 412c along the circumferential edge 412 of wafer 402. Kerf line 420c intersects point 412c in a direction that is radial with respect to circumferential edge 412. Wafer edge area 404a is singulated along a boundary of interior region 210 as illustrated by interconnected kerf line segments 202-204 between the endpoints 216a and 216c.

A radial distance 424 is defined in FIG. 4 between the boundary of interior region 210 and circumferential edge 412 of wafer 402. Radial distance 424 is illustrated between endpoint 218d of the two endpoints 216d-218d of kerf line segment 204d and the circumferential edge 412 of wafer 402. In one or more of the embodiments illustrated herein, radial distance 424 can be determined between one of either endpoints 212-214 or endpoints 216-218 and circumferential edge 412 of wafer 402. Radial distance 424 illustrates a minimum distance between endpoints 212-214 or endpoints 216-218 and circumferential edge 412 of wafer 402. In these embodiments the radial distance 424 is equal to or greater than 2 mm. In other embodiments, radial distance 424 can be equal to or greater than other suitable values that are less than 2 mm or greater than 2 mm.

In other embodiments, one or more of the wafer edge areas 404 have at least one of the two kerf lines 420 that intersect circumferential edge 412 in a direction that is radial with respect to circumferential edge 412. For example, in one embodiment, wafer edge area 404 is singulated by two kerf lines 420 where one of the kerf lines 420 intersects a point along the circumferential edge 412 that is collinear with endpoints 216c-218c and the other one of the kerf lines 420 intersects a point along circumferential edge 412 that is radial with respect to circumferential edge 412.

In the embodiment illustrated in FIG. 4, kerf line 420a has a width (refer to FIG. 6 for definition) that is equal to a width of kerf line segment 204a. In other embodiments, kerf line 420a can have a width that is greater than or less than a width of kerf line segment 204a. In the embodiment illustrated in FIG. 4, kerf line 420c has a width that is equal to a width of kerf line segment 204c. In other embodiments, kerf line 420c can have a width that is greater than or less than a width of kerf line segment 204c.

Figure 5:
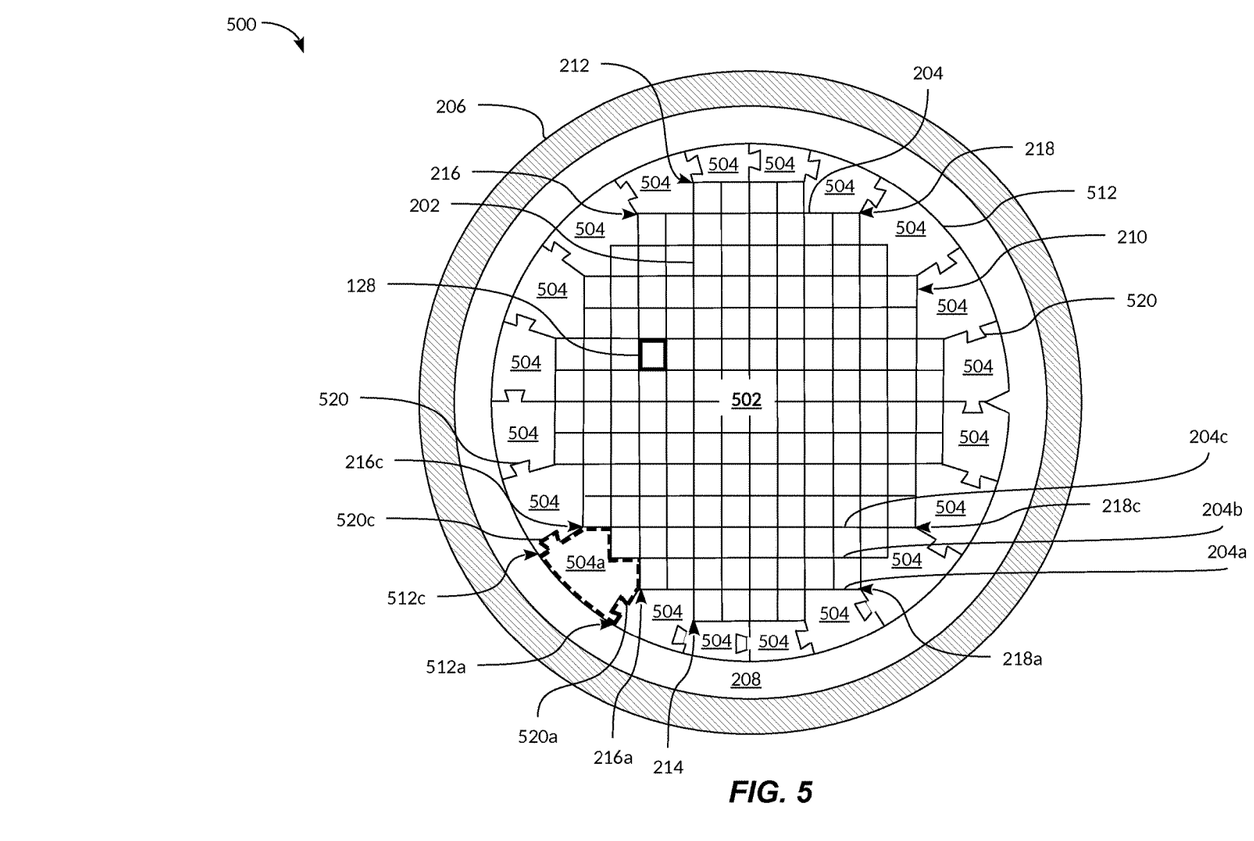
FIG. 5 illustrates a top plan view of an embodiment of a singulated wafer mounted in a wafer frame.

FIG. 5 illustrates a top plan view at 500 of an embodiment of a singulated wafer 502 mounted in a wafer frame 206. In the embodiment illustrated in FIG. 5, the methods illustrated in FIGS. 1A-1C can be used to singulate die 128 and to singulate a plurality of wafer edge areas 504. The die 128 are located between vertical kerf line segments 202 and horizontal kerf line segments 204. Kerf line segments 202 and 204 are located within an interior region 210 of singulated wafer 502. The plurality of singulated wafer edge areas 504 are between kerf line segments 202-204 and the circumferential edge 512 of wafer 502. Each one of the plurality of wafer edge areas 504 is singulated by two kerf lines 520 that each extend between one of two endpoints 212-214 or 216-218 of the corresponding kerf line segment 202-204 and the circumferential edge 512 of wafer 502. The two kerf lines 520 that singulate each one of the plurality of wafer edge areas 504 have a shape or path that defines interlocking joints between adjacent ones of the plurality of wafer edge areas 502. In the embodiment illustrated in FIG. 5, the interlocking joints defined by kerf lines 520 comprise male and female members that form a contiguous boundary between adjacent wafer edge areas 504. In the illustrated embodiment, the male and female members comprise a male trapezoidal segment and a female trapezoidal segment. Kerf line 520a defines a female trapezoidal segment within wafer edge area 504a and a male trapezoidal segment within adjacent wafer edge area 504 that shares the contiguous boundary defined by kerf line 520a. Kerf line 520c defines a male trapezoidal segment within wafer edge area 504a and a female trapezoidal segment within adjacent wafer edge area 504 that shares the contiguous boundary defined by kerf line 520c. In other embodiments, the contiguous boundary between adjacent wafer edge areas 504 can form any suitable interlocking relationship between the adjacent wafer edge areas 504.

In the embodiment illustrated in FIG. 5, wafer edge area 504a is illustrated by a dashed line. Wafer edge area 504a is singulated by kerf line 520a and kerf line 520c. Kerf line 520a extends between endpoint 216a of kerf line segment 204a and a point 512a along the circumferential edge 512 of wafer 502. Kerf line 520c extends between endpoint 216c of kerf line segment 204c and a point 512c along the circumferential edge 512 of wafer 102. Wafer edge area 504a is singulated along a boundary of interior region 210 as illustrated by interconnected kerf line segments 202-204 between the endpoints 216a and 216c.

In various embodiments, before pick and place tape release techniques are used to remove die 128 from foil 208 for packaging, foil 208 is expanded to enhance the ease of removal of die 128 from foil 208. This expansion increases a space between adjacent die 128, between die 128 and the wafer edge areas 504, and between adjacent wafer edge areas 504. During the expansion process, foil 208 can be expanded or stretched in all directions or in a direction of any number of one or more axes in the plane of wafer 502. For example, foil 208 can be expanded in a direction that is along an axis of vertical kerf line segments 202 and/or horizontal kerf line segments 204. Foil 208 can be expanded by the same amount, or by different amounts, in these directions. For example, by selectively expanding foil 208 in one or more directions that are radial to a circumference 512 of wafer 502, the transfer of die 128 can be optimized to improve the overall good die yields after die 128 is transferred from foil 208 to a die carrier. In various embodiments, this transfer is accomplished by using a pick and place tool that uses a vacuum die collet that is controlled by a robotic mechanism. The robotic mechanism picks die 128 from foil 208 of wafer frame 206 by using a suction action, and holds the die securely before depositing the die 128 into the die carrier.

In the embodiment illustrated in FIG. 5, kerf line 520a has a width (refer to FIG. 6 for definition) that is equal to a width of kerf line segment 204a. In other embodiments, kerf line 520a can have a width that is greater than or less than a width of kerf line segment 204a. In the embodiment illustrated in FIG. 5, kerf line 520c has a width that is equal to a width of kerf line segment 204c. In other embodiments, kerf line 520c can have a width that is greater than or less than a width of kerf line segment 204c. For all of the wafer edge areas 504, the width of corresponding kerf lines 520a and 520c can each be adjusted such that the interlocking joints formed by kerf lines 520a and 520c with adjacent wafer edge areas 504 limit movement between the respective wafer edge areas 504 when foil 208 is expanded. This movement can be limited to a range that corresponds to the widths of kerf lines 520a and 520c (refer to FIG. 6).

Figure 6:
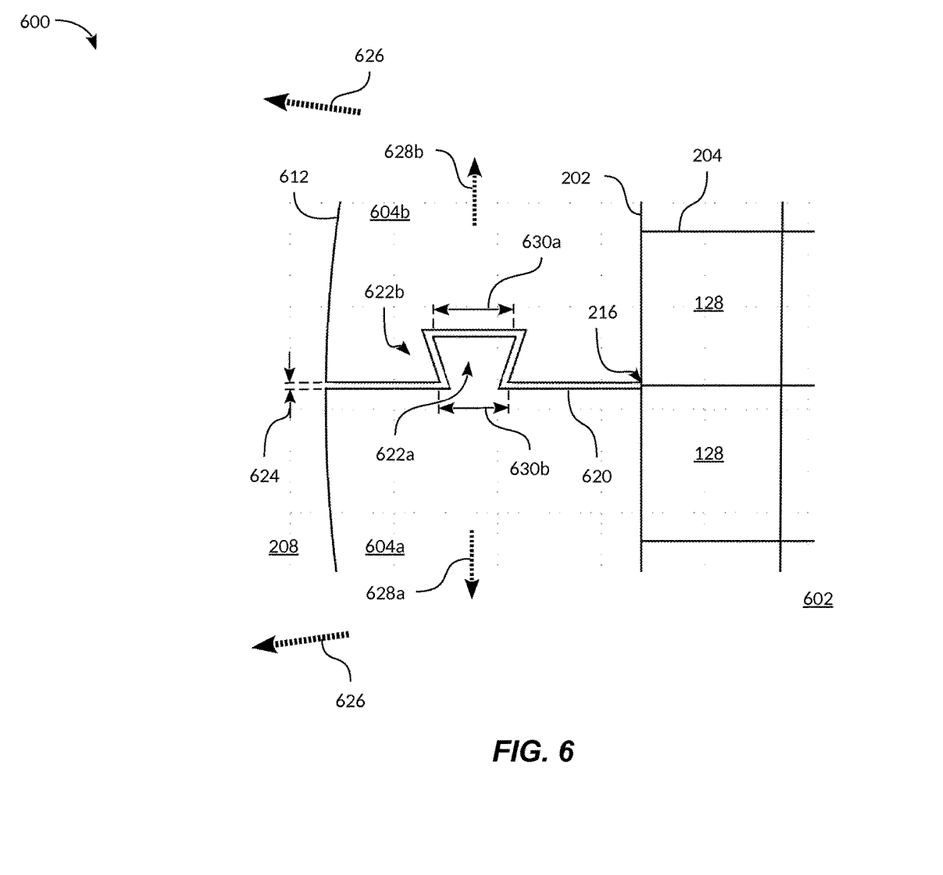
FIG. 6 illustrates a partial top view of an embodiment of a singulated wafer that illustrates singulated wafer edge areas.

FIG. 6 illustrates a partial top view at 600 of an embodiment of a singulated wafer 602 that illustrates singulated wafer edge areas 604a and 604b. Interlocking joints are defined by kerf line 620 that include a male member 622a and a female member 622b. Kerf line 620 forms a contiguous boundary between the adjacent wafer edge areas 604a and 604b. In the embodiment illustrated in FIG. 6, male member 622a is a male trapezoidal segment 622a within wafer edge area 604a, and female member 622b is a female trapezoidal segment 622b within wafer edge area 604b. In various embodiments, a width 624 of kerf line 620 can be adjusted such that the interlocking joint formed by kerf line 620 limits movement between wafer edge areas 604a and 604b when singulated wafer 602 is expanded by foil 208.

FIG. 6 illustrates at 626 an expansion of foil 208 in a direction that is radial with respect to circumferential edge 612 of singulated wafer 602. The expansion of foil 208 in the radial direction 626 increases a spacing between singulated die 128, between singulated die 128 and wafer edge areas 604a and 604b, and between adjacent wafer edge areas 604a and 604b. The interlocking joint formed by kerf line 620 between adjacent wafer edge area 604a and wafer edge area 604b limits the amount of separation between wafer edge areas 604a and 604b, in the directions illustrated at 628a and 628b, to be within a range. This range corresponds to a width of kerf line 620 during separation and has an upper limit that is proportional to width 624 of kerf line 620 before foil 208 is expanded. Male trapezoidal segment 622a defines an upper portion having a width as illustrated at 630a. Female trapezoidal segment 622b has a lower portion or opening having a width illustrated at 630b. Because width 630a of male trapezoidal segment 622a is greater than width 630b of female trapezoidal segment 622b, movement between male trapezoidal segment 622a and female trapezoidal segment 622b in the respective directions illustrated at 628a and 628b is limited to be within a range. This range has an upper limit that corresponds to a total amount of separation that can be achieved before male trapezoidal segment 622a and female trapezoidal segment 622b make physical contact. This upper limit has a positive correlation with the magnitude of width 624 before foil 208 is expanded.

In other embodiments, the interlocking joints can have other suitable shapes or dimensions. Kerf line 620 has a width 624 that is greater than a width of kerf line segments 202 and 204. In other embodiments, width 624 can be equal to a width of kerf line segments 202 and 204, or can be less than a width of kerf line segments 202 and 204. In other embodiments, width 624 can vary for one or more than one of the interlocking joints within the singulated wafer 602 in order to control the amount of expansion between adjacent wafer edge areas 604 around circumference 612 of wafer 602.

Figure 7:
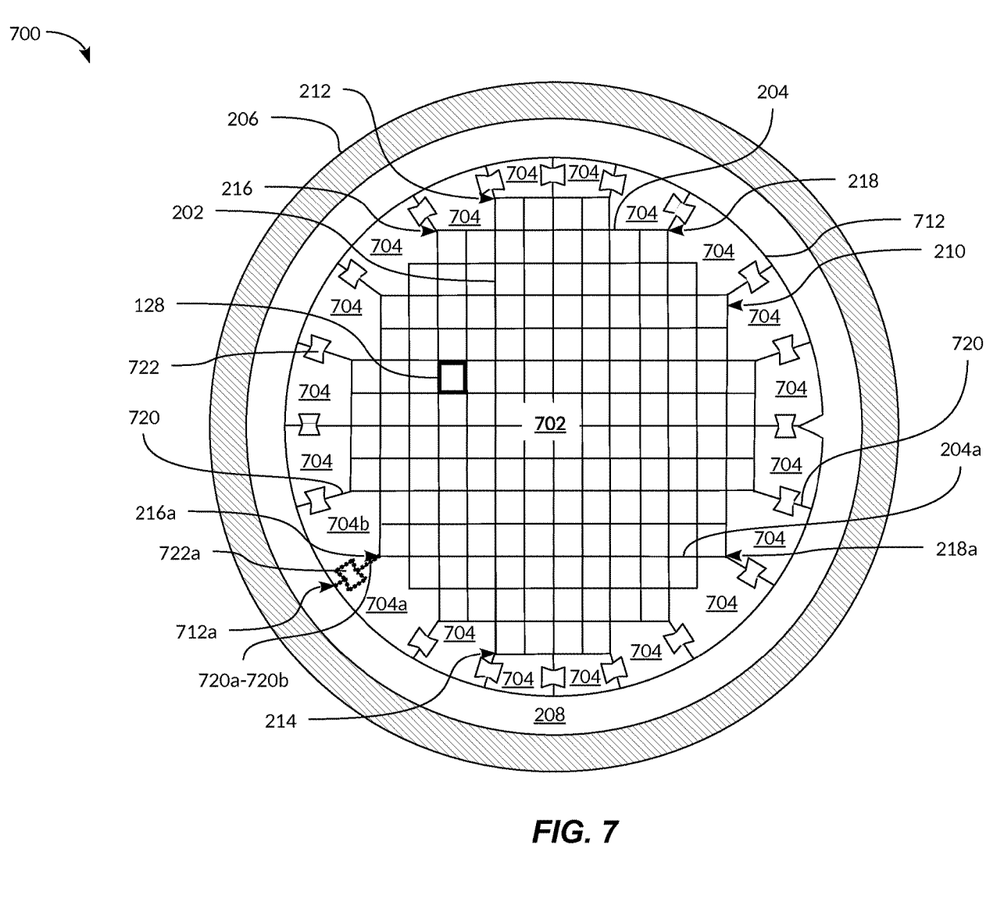
FIG. 7 illustrates a top plan view of an embodiment of a singulated wafer mounted in a wafer frame.

FIG. 7 illustrates a top plan view at 700 of an embodiment of a singulated wafer 702 mounted in a wafer frame 206. In the embodiment illustrated in FIG. 7, the methods illustrated in FIGS. 1A-1C can be used to singulate die 128 and to singulate a plurality of wafer edge areas 704. The die 128 are located between vertical kerf line segments 202 and horizontal kerf line segments 204. Kerf line segments 202 and 204 are located within an interior region 210 of singulated wafer 702. The plurality of singulated wafer edge areas 704 are between kerf line segments 202-204 and the circumferential edge 712 of wafer 702. Each one of the plurality of wafer edge areas 704 is singulated by two kerf lines 720 that each extend between one of two endpoints 212-214 or 216-218 of the corresponding kerf line segment 202-204 and the circumferential edge 712 of wafer 702. The kerf lines 720 that singulate each one of the plurality of wafer edge areas 702 have a shape or path that defines an interlocking joint between adjacent ones of the plurality of wafer edge areas 702. The interlocking joint comprises a singulated segment 722 that forms an interlocked and co-planar relationship with the adjacent ones of the plurality of wafer edge areas 704. In the embodiment illustrated in FIG. 7, an exemplary singulated segment 722a formed by kerf lines 720a-720b (refer to dashed line) that overlap in areas adjacent to endpoint 216a and circumferential edge point 712a. The kerf lines 720a-720b split around segment 722a and singulate segment 722a.

In the embodiment illustrated in FIG. 7, kerf lines 720a-720b have a width (refer to FIG. 8 for definition) that is equal to a width of kerf line segment 204a. In other embodiments, kerf lines 720a-720b can have a width that is greater than or less than a width of kerf line segment 204a. For each wafer edge area 704, the width of kerf lines 720a-720b can be adjusted such that the interlocking joint formed by kerf lines 720a-720b and singulated segment 722a limit movement between wafer edge areas 704a and 704b when foil 208 is expanded. This movement is limited to a range that corresponds to the width of kerf lines 720a-720b (refer to FIG. 8).

Figure 8:
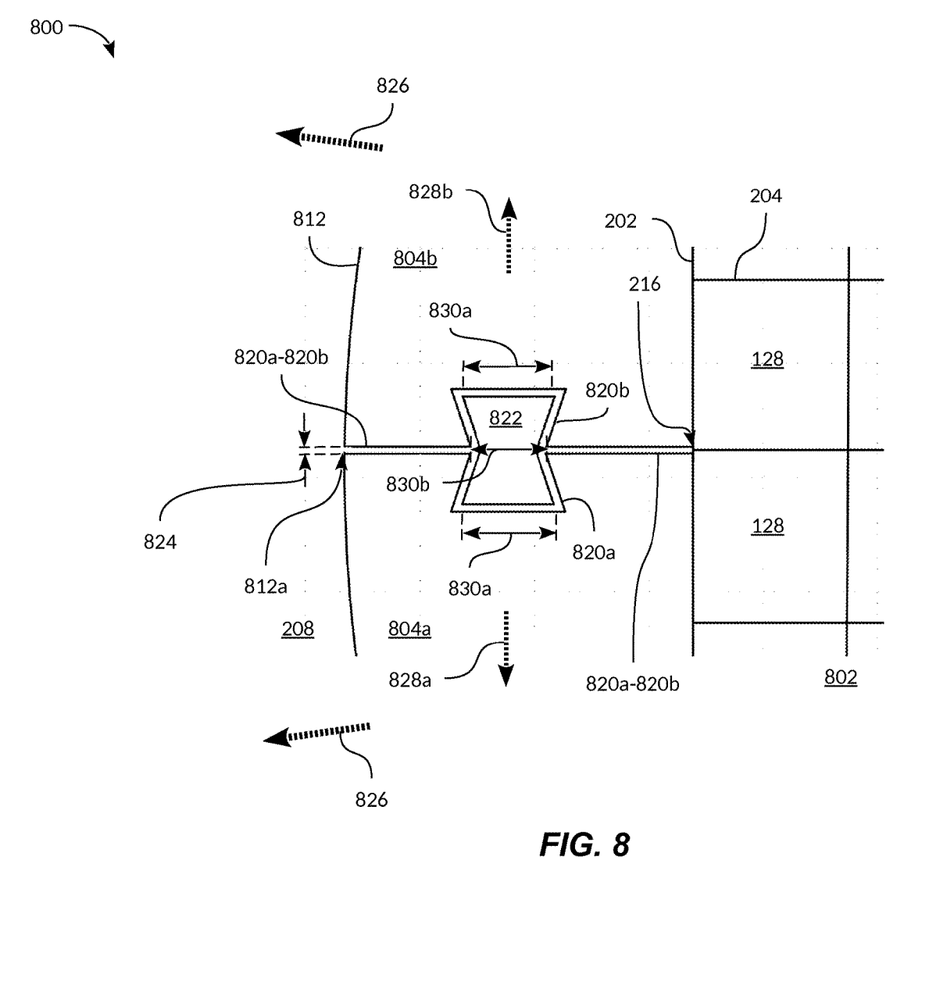
FIG. 8 illustrates a partial top view of an embodiment of a singulated wafer that illustrates singulated wafer edge areas.

FIG. 8 illustrates a partial top view at 800 of an embodiment of a singulated wafer 802 that illustrates singulated wafer edge areas 804a and 804b. The kerf lines 820a-820b that singulate wafer edge areas 804a and 804b define a singulated segment 822 that forms an interlocked and co-planar relationship with the adjacent wafer edge areas 804a and 804b. Kerf lines 820a-820b overlap in areas adjacent to endpoint 216 and circumferential edge point 812a. The kerf lines 820a-820b split around segment 822 and singulate segment 822. Kerf line 820a forms a contiguous boundary between a lower portion of segment 822 and wafer edge area 804a. Kerf line 820b forms a contiguous boundary between an upper portion of segment 822 and wafer edge area 804b.

In the embodiment illustrated in FIG. 8, segment 822 includes an upper male trapezoidal segment and a lower male trapezoidal segment that each have a maximum width illustrated at 830a. Wafer edge areas 804a and 804b each include complementary female trapezoidal segments that are contiguous, respectively, with kerf lines 820a and 820b that are adjacent to a boundary of segment 822. The female trapezoidal segments within wafer edge areas 804a and 804b have a minimum width illustrated at 830b. In the illustrated embodiment, width 830a is greater than width 830b.

FIG. 8 illustrates at 826 an expansion of foil 208 in a direction that is radial with respect to circumferential edge 812 of singulated wafer 802. The expansion of foil 208 in the radial direction 826 increases a spacing between singulated die 128, between singulated die 128 and wafer edge areas 804a and 804b, and between adjacent wafer edge areas 804a and 804b. The interlocking joint formed by segment 822 between adjacent wafer edge area 804a and 804b limits the amount of separation during expansion of foil 208 between wafer edge areas 804a and 804b, in the directions illustrated at 828a and 828b to be within a range. This range is defined by a width of kerf lines 820a-820b during separation and has an upper limit that is proportional to width 824 of kerf lines 820a-820b before foil 208 is expanded. Because width 830a of the top and bottom male trapezoidal portions of segment 822 is greater than width 830b of the openings of the female trapezoidal portions within wafer edge areas 804a and 804b, the range of expansion has an upper limit that corresponds to a total amount of separation that can be achieved before segment 822 makes physical contact with one or both of wafer edge areas 804a and 804b. This upper limit has a positive correlation with the magnitude of width 824 before foil 208 is expanded. In the embodiment illustrated in FIG. 8, kerf line 820a and kerf line 820b both have a same width 824.

In other embodiments, segment 822 can have other suitable shapes or dimensions that define an interlocking joint between adjacent wafer edge areas 804a and 804b. In the embodiment illustrated in FIG. 8, kerf lines 820a and 820b have a width 824 that is greater than a width of kerf line segments 202 and 204. In other embodiments, width 824 can be equal to a width of kerf line segments 202 and 204, or can be less than a width of kerf line segments 202 and 204. In other embodiments, width 824 of kerf lines 820a-820b can vary for one or more of the segments 822 in order to control the amount of expansion between adjacent wafer edge areas 804a and 804b around circumference 812 of wafer 802.

Figure 9:
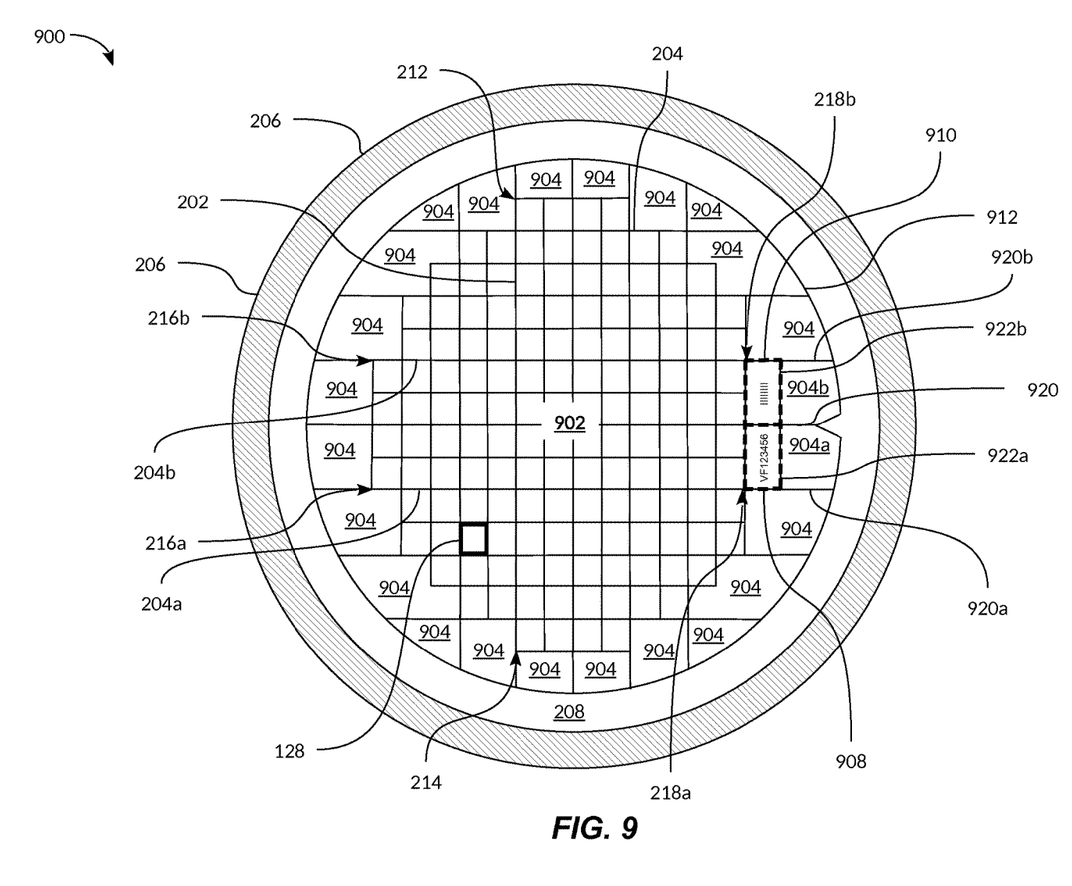
FIG. 9 illustrates a top plan view of an embodiment of a singulated wafer mounted in a wafer frame.

FIG. 9 illustrates a top plan view at 900 of an embodiment of a singulated wafer 902 mounted in a wafer frame 206. At least one of the wafer edge areas 904 illustrated in FIG. 9 includes human-readable information or machine-readable information. In the embodiment illustrated in FIG. 9, the human-readable information in region 908 (see dashed outline) can have any suitable format that includes, but is not limited to, alphanumeric data. In the embodiment illustrated in FIG. 9, the machine-readable information in region 910 (see dashed outline) is a scannable barcode or universal product code. In other embodiments, the machine-readable information can have other suitable formats.

In the embodiment illustrated in FIG. 9, wafer edge area 904a includes human-readable information within a region 908 that is singulated by a kerf line 922a. Kerf line 922a intersects kerf line 920a. Kerf line 920a extends between endpoint 218a of kerf line segment 204a and circumferential edge 912 of wafer 902. Wafer edge area 904b includes machine-readable information within a region 910 that is singulated by a kerf line 922b. Kerf line 922b intersects kerf line 920b. Kerf line 920b extends between endpoint 218b of kerf line segment 204b and circumferential edge 912 of wafer 902.

Figure 10:
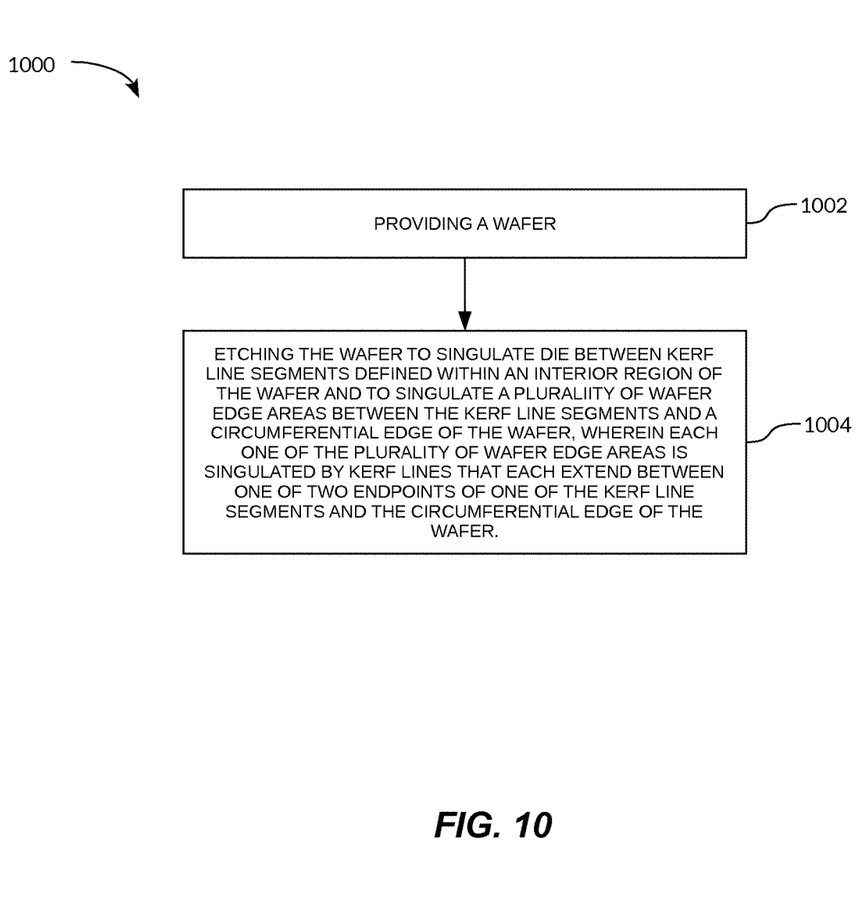
FIG. 10 illustrates a flowchart of an embodiment of a method for dicing a wafer.

FIG. 10 illustrates a flowchart of an embodiment of a method for dicing a wafer. The method is illustrated at 1000. At 1002, a wafer 102 is provided. At 1004, wafer 102 is etched to singulate die 128 and to singulate a plurality of wafer edge areas 130. Die 128 are singulated between kerf line segments 202 and 204 that are defined within an interior region 210 of wafer 102. The plurality of wafer edge areas 130 are singulated between the kerf line segments 202 and 204 and a circumferential edge 112 of wafer 102. Each one of the plurality of wafer edge areas 130 is singulated by kerf lines 220 that each extend between one of the two endpoints 212 or 214 for kerf line segment 202 or one of the two endpoints 216 or 218 for kerf line segment 204 and circumferential edge 112 of wafer 102.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of dicing a wafer, the method comprising:
providing a wafer; and
etching the wafer to singulate die between kerf line segments defined within an interior region of the wafer and to singulate a plurality of wafer edge areas between the kerf line segments and a circumferential edge of the wafer, wherein each one of the plurality of wafer edge areas is singulated by kerf lines that each extend between one of two endpoints of one of the kerf line segments and the circumferential edge of the wafer, wherein the kerf line segments comprise N parallel kerf line segments where N is an integer that is equal to or greater than 3, wherein one or more of the plurality of wafer edge areas are singulated by the kerf lines that each extend between the one of the two endpoints of every Mth one of the N parallel kerf line segments and the circumferential edge of the wafer, and wherein M is an integer that is equal to or greater than 2 and equal to or less than N.

2. The method of claim 1, wherein one or more of the plurality of wafer edge areas are singulated by the kerf lines that each intersect the circumferential edge of the wafer at a point that is collinear with the two endpoints of the one of the kerf line segments.

3. The method of claim 1, wherein one or more of the plurality of wafer edge areas are singulated by the kerf lines that are radial with respect to the circumferential edge of the wafer.

4. The method of claim 1, wherein the plurality of wafer edge areas are singulated by the kerf lines that define an interlocking joint between adjacent ones of the plurality of wafer edge areas, wherein the interlocking joint limits movement between the adjacent ones of the plurality of wafer edge areas to be within a range that corresponds to a width of the kerf lines.

5. The method of claim 4, wherein a width of the kerf lines is equal to or greater than a width of one or more of the kerf line segments.

6. The method of claim 4, wherein the interlocking joint comprises male and female members that form a contiguous boundary between the adjacent ones of the plurality of wafer edge areas.

7. The method of claim 4, wherein the interlocking joint comprises a singulated segment that forms an interlocked and co-planar relationship with the adjacent ones of the plurality of wafer edge areas.

8. The method of claim 1, wherein at least one of the plurality of wafer edge areas includes human-readable or machine-readable information within a region that is singulated by at least one kerf line that intersects at least one of the kerf lines that each extend between the one of the two endpoints of the one of the kerf line segments and the circumferential edge of the wafer.

9. A wafer comprising:
a plurality of singulated die between kerf line segments defined within an interior region of the wafer; and
a plurality of singulated wafer edge areas between the kerf line segments and the circumferential edge of the wafer, wherein the kerf line segments comprise N parallel kerf line segments where N is an integer that is equal to or greater than 3, wherein one or more of the plurality of wafer edge areas are singulated by the kerf lines that each extend between the one of the two endpoints of every Mth one of the N parallel kerf line segments and the circumferential edge of the wafer, wherein M is an integer that is equal to or greater than 2 and equal to or less than N, and wherein each one of the plurality of wafer edge areas is between kerf lines that each extend between one of two endpoints of one of the kerf line segments and the circumferential edge of the wafer.

10. The wafer of claim 9, wherein one or more of the plurality of singulated wafer edge areas are between the kerf lines that each intersect the circumferential edge of the wafer at a point that is collinear with the two endpoints of the one of the kerf line segments.

11. The wafer of claim 9, wherein the kerf line segments comprise N parallel kerf line segments where N is an integer that is equal to or greater than 3, wherein one or more of the plurality of singulated wafer edge areas are between the kerf lines that each extend between the one of the two endpoints of every Mth kerf line segment and the circumferential edge of the wafer, and wherein M is an integer that is equal to or greater than 2 and equal to or less than N.

12. The wafer of claim 9, wherein one or more of the plurality of singulated wafer edge areas are between the kerf lines that are radial with respect to the circumferential edge of the wafer.

13. The wafer of claim 9, wherein a radial distance between the one of the two endpoints of the one of the kerf line segments and the circumferential edge of the wafer is equal to or greater than 2 mm.

14. The wafer of claim 9, wherein the plurality of singulated wafer edge areas are between the kerf lines that define an interlocking joint between adjacent ones of the plurality of singulated wafer edge areas, wherein the interlocking joint limits movement between the adjacent ones of the plurality of singulated wafer edge areas to be within a range that corresponds to a width of the kerf lines.

15. The wafer of claim 14, wherein the interlocking joint comprises male and female members that form a contiguous boundary between the adjacent ones of the plurality of singulated wafer edge areas.

16. The wafer of claim 15, wherein the male and female members comprise a male trapezoidal segment and a female trapezoidal segment.

17. The wafer of claim 14, wherein the interlocking joint comprises a singulated segment that forms an interlocked and co-planar relationship between the adjacent ones of the plurality of wafer edge areas.

18. The wafer of claim 14, wherein the width of the kerf lines is equal to or greater than a width of one or more of the kerf line segments.

19. The wafer of claim 9, wherein at least one of the plurality of singulated wafer edge areas includes singulated human-readable or machine-readable information within a region adjacent to at least one kerf line that intersects at least one of the kerf lines that each extend between the one of the two endpoints of the one of the kerf line segments and the circumferential edge of the wafer.

20. A lithography mask comprising:
a first feature set for patterning a material on a wafer to define kerf line segments within an interior region of the wafer; and
a second feature set for patterning the material on the wafer to define kerf lines that each extend between one of two endpoints of one of the kerf line segments and the circumferential edge of the wafer, wherein the kerf line segments comprise N parallel kerf line segments where N is an integer that is equal to or greater than 3, wherein one or more of the plurality of wafer edge areas are singulated by the kerf lines that each extend between the one of the two endpoints of every Mth one of the N parallel kerf line segments and the circumferential edge of the wafer, wherein M is an integer that is equal to or greater than 2 and equal to or less than N, wherein the first feature set defines die to be singulated, and the second feature set defines a plurality of wafer edge areas to be singulated.

21. The lithography mask of claim 20, wherein the second feature set defines one or more of the kerf lines that each intersect the circumferential edge of the wafer at a point that is collinear with the two endpoints of the one of the kerf line segments.

22. The lithography mask of claim 20, wherein the second feature set defines the kerf lines that are radial with respect to the circumferential edge of the wafer.

23. The lithography mask of claim 20, wherein the second feature set defines the kerf lines that define an interlocking joint between adjacent ones of the plurality of wafer edge areas, wherein the interlocking joint limits movement between the adjacent ones of the plurality of wafer edge areas to be within a range that corresponds to a width of the kerf lines.

24. A method of dicing a wafer, the method comprising:
providing a wafer;
mounting the wafer to a wafer frame and foil;
etching the wafer to form a plurality of dies between kerf line segments defined within an interior region of the wafer, and to form a plurality of singulated wafer edge areas between the kerf line segments and a circumferential edge of the wafer, wherein one of the plurality of dies is singulated by at least one of the kerf line segments, wherein a first direction is perpendicular to the at least one of the kerf line segments, wherein one of the plurality of singulated wafer edge areas is singulated by at least one kerf line that extends between one of two endpoints of the at least one of the kerf line segments and the circumferential edge of the wafer, wherein the one of the plurality of singulated wafer edge areas has a first width in the first direction, wherein the one of the plurality of dies has a second width in the first direction, and wherein the first width is larger than the second width; and
expanding the foil to separate the plurality of dies.

25. The method of claim 24, wherein the first width is at least two times the second width.

26. The method of claim 24, wherein each one of the plurality of singulated wafer edge areas is between kerf lines that each extend between the one of the two endpoints of one of the kerf line segments and the circumferential edge of the wafer.

27. The method of claim 26, wherein one or more of the plurality of singulated wafer edge areas are between the kerf lines that each intersect the circumferential edge of the wafer at a point that is collinear with the two endpoints of the one of the kerf line segments.

28. The method of claim 26, wherein the kerf line segments comprise N parallel kerf line segments where N is an integer that is equal to or greater than 3, wherein one or more of the plurality of singulated wafer edge areas are between the kerf lines that each extend between the one of the two endpoints of every Mth kerf line segment and the circumferential edge of the wafer, and wherein M is an integer that is equal to or greater than 2 and equal to or less than N.

29. The method of claim 26, wherein a radial distance between the one of the two endpoints of the one of the kerf line segments and the circumferential edge of the wafer is equal to or greater than 2 mm.

30. The method of claim 26, wherein at least one of the plurality of singulated wafer edge areas includes singulated human-readable or machine-readable information within a region adjacent to at least one kerf line that intersects at least one of the kerf lines that each extend between the one of the two endpoints of the one of the kerf line segments and the circumferential edge of the wafer.

31. The method of claim 24, wherein one or more of the plurality of singulated wafer edge areas are between the kerf lines that are radial with respect to the circumferential edge of the wafer.

32. The method of claim 24, wherein the plurality of singulated wafer edge areas are between the kerf lines that define an interlocking joint between adjacent ones of the plurality of singulated wafer edge areas, wherein the interlocking joint limits movement between the adjacent ones of the plurality of singulated wafer edge areas to be within a range that corresponds to a width of the kerf lines.

33. The method of claim 32, wherein the interlocking joint comprises male and female members that form a contiguous boundary between the adjacent ones of the plurality of singulated wafer edge areas.

34. The method of claim 33, wherein the male and female members comprise a male trapezoidal segment and a female trapezoidal segment.

35. The method of claim 32, wherein the interlocking joint comprises a singulated segment that forms an interlocked and co-planar relationship between the adjacent ones of the plurality of wafer edge areas.

* * * * *